(12) United States Patent
Rzehak et al.

(10) Patent No.: US 8,542,047 B2
(45) Date of Patent: Sep. 24, 2013

(54) ELECTRONIC DEVICE AND METHOD FOR LOW POWER RESET

(75) Inventors: Volker Rzehak, Ergolding (DE); Johann Zipperer, Unterschleissheim (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 13/275,862

(22) Filed: Oct. 18, 2011

(65) Prior Publication Data

US 2013/0093487 A1    Apr. 18, 2013

(51) Int. Cl.
*H03K 3/02*    (2006.01)

(52) U.S. Cl.
USPC .......................... 327/198; 327/142; 327/143

(58) Field of Classification Search
USPC ................ 327/142, 143, 198, 72, 73, 74, 77, 327/58, 315, 316, 50, 545, 91
See application file for complete search history.

(56) References Cited

U.S. PATENT DOCUMENTS 5,760,624 A * 6/1998 McClintock ................. 327/143
6,138,246 A * 10/2000 Petty ............................ 713/500
6,683,481 B1 * 1/2004 Zhou et al. ................... 327/143

\* cited by examiner

*Primary Examiner* — Long Nguyen
*Assistant Examiner* — Thomas Skibinski
(74) *Attorney, Agent, or Firm* — William B. Kempler; W. James Brady, III; Frederick J. Telecky, Jr.

(57) ABSTRACT

An electronic device and a method for operating an electronic device, wherein the electronic device comprises a reset stage which is configured to have a power down threshold and a power cycle threshold. The voltage level of the power cycle threshold is lower than the voltage level of the power down threshold. The two threshold levels define a first and second interval for a supply voltage of the electronic device. A first interval is between the power cycle threshold and the power down threshold. A second interval is above the power down threshold. The reset stage is further configured to provide the control signal having a defined first state in the first interval and a defined second state in the second interval. The electronic device is set to a low power reset mode if the control signal is in the first state and the electronic device is enabled to enter an active mode if the control signal is in the second state.

4 Claims, 4 Drawing Sheets

ELECTRONIC DEVICE AND METHOD FOR LOW POWER RESET

FIELD OF THE INVENTION

The invention relates to an electronic device comprising a reset state having two reset voltage levels. Further, the invention relates to a method of operating an electronic device.

BACKGROUND OF THE INVENTION

The invention relates to electronic devices which use, e.g. alkaline batteries, for the power supply must not be discharged at high currents if the batteries have reached their end of life voltage. Otherwise, the battery may leak and destroy the electronic device before being replaced. Electronic devices having a microcontroller are usually set into a reset mode if the supply voltage drops below a certain threshold. Typically, this threshold value is defined by the minimum supply voltage of the microcontroller. In the reset mode, the microcontroller is kept in a defined state which allows a quick start up if the supply voltage rises again.

FIG. 1a to 1c illustrate a typical behavior of an electronic device which is coupled to a varying power supply voltage VCC. FIG. 1a shows the time-dependent supply voltage VCC, FIG. 1b shows the time-dependent Brownout signal BOR and FIG. 1c shows the current IVCC which is taken by the electronic device at the respective points in time. The electronic device is activated if the supply voltage VCC exceeds the voltage level VOFF. Accordingly, the Brownout signal BOR is set from LOW to HIGH. The electronic device starts operation and continues until the supply voltage VCC drops below the minimum supply voltage threshold VON. Subsequently, the Brownout signal BOR will be set from HIGH to LOW and the electronic device enters the reset state.

There is a small hysteresis between the voltage levels VOFF and VON in order to prevent the electronic device from undesired fast switching between the reset state and the active state. However, the voltage levels VOFF and VON derive from a single threshold voltage which separates the reset state from the active state. If the supply voltage is above this threshold, the electronic device is activated. If the supply voltage is below this threshold, the electronic device is in the reset state. The exact value of this threshold varies very little depending on whether a raising or sinking supply value exceeds the threshold and causes the electronic device to enter the active mode and reset mode, respectively. This is due to the small hysteresis between the voltage levels VOFF and VON. However, within the context of this specification, notwithstanding the fact that there is a small difference between the voltage levels VOFF and VON, they will be regarded as a single threshold because they derive from one and the same threshold value.

The power consumption IVCC of the electronic device (see FIG. 1c) varies if the electronic device is in the active state and drops to zero (according to the IVCC-graph FIG. 1c) if the supply voltage VCC drops below VON. The state of the electronic device is indicated by the Brownout signal BOR. A HIGH Brownout signal indicates the active mode and a LOW Brownout signal indicates the reset state. At a first sight and according to the IVCC-graph in FIG. 1c, the power consumption drops to zero in the reset state. However, the microcontroller's power consumption in the reset state is not equal to zero, it will be a few µA or even higher. This is mainly due to the fact, the microcontroller is kept in a state allowing a fast start up if the supply voltage VCC rises again. The power consumption in the reset state may be too high to prevent the alkaline batteries, which are driving the electronic device, from leaking.

A further risk for battery leakage in a prior art battery-driven electronic device derives from its undefined behavior taking place at low supply voltages. The electronic device starts operation if the supply voltage VCC exceeds VSTART (see FIG. 1a). A Brownout module, which may be a part of the electronic device, starts operating and sets the Brownout signal BOR to LOW, because the supply voltage VCC does not exceed the threshold VOFF. However, at a voltage level VTH which is far below VSTART, there is an undefined operation of the electronic device. The Brownout module provides an undefined Brownout signal BOR. For instance, the Brownout signal BOR rises together with the supply voltage VCC even though the supply voltage VCC is well below VOFF (which is the voltage level for the electronic device to change to the active mode). The undefined Brownout signal BOR is indicated by the dashed line in FIG. 1b. The undefined Brownout signal BOR may lead to an uncontrolled behavior of the electronic device. This can result in reasonable power consumption peaks IPEAK which increase the danger of battery leakage.

There is a danger that the batteries may leak if these are discharged beyond a certain threshold voltage. FIG. 2 illustrates the battery voltage VBAT of a typical alkaline battery during operation of an electronic device. By way of an example only, the electronic device is operated for 3 to 6 months. During this time, the battery voltage VBAT drops from the initial value of 1.5 V to 0.9 V. At a minimum supply voltage of VON=0.9 V (see FIG. 1a), the electronic device enters the reset mode. However, even in the reset mode, there is reasonable power consumption and due to this, the battery voltage VBAT drops further, i.e. from 0.9 V to 0.6 V. This will take approximately 1 to 2 months, according to the example in FIG. 2. For battery voltages below 0.6 V, there is a danger of battery leakage. This situation can last for several years as it is indicated by the tail portion of the battery voltage VBAT curve. Accordingly, the battery may leak and destroy the electronic device before the battery is replaced by the user.

SUMMARY OF THE INVENTION

It is a general object of the invention to provide an electronic device and a method for operating an electronic device, wherein the electronic device has a reduced power consumption at low-supply voltages.

According to an aspect of the invention, an electronic device having a reset stage is provided, which is configured to have a power down threshold and a power cycle threshold. The voltage level of the power cycle threshold is lower than the voltage level of the power down threshold, wherein these two reset threshold levels define a first and a second interval for a supply voltage of the electronic device. The first interval is between the power cycle threshold and the power down threshold and the second interval is above the power down threshold. Further, the reset stage may be configured to provide a control signal having a defined first state in the first interval and a defined second state in the second interval. The electronic device may be set to a low power reset mode if the control signal is in the first state. Further, the electronic device may be enabled to enter an active mode if the control signal is in the second state.

When reaching its minimum supply voltage level, an electronic device according to the prior art enters a reset mode or status. An electronic device according to the prior art will stay in this reset mode as long as the supply voltage or battery voltage is below the minimum supply voltage threshold. The electronic device according to aspects of the invention enters a reset mode too, but in contrast to the prior art, there is a well-defined lower limit for the supply voltage, i.e. the power cycle threshold. Accordingly, there are two reset voltage levels instead of a single reset voltage level in electronic devices known in the prior art. The electronic device according to aspects of the invention is set to an ultralow power mode in a controlled and well-defined way, as long as the supply voltage level is in the first interval, i.e. between the power down threshold and the power cycle threshold. This guarantees minimal power consumption if the supply voltage falls below the power down threshold. Consequently, if the supply voltage, i.e. a battery voltage, drops below the power down voltage level, there is very little power consumption of the electronic device, which prevents the battery from being further discharged more or less quickly. This defined state of the electronic device may be upheld as long as the supply voltage is above the power cycle threshold. Because the power consumption is kept at a very low level, the point in time, when the battery voltage drops below the typical battery leakage voltage, may be delayed. The time period where there is no danger of leakage may be extended up to years instead of months in electronic devices known in the prior art. The low power mode is maintained until replacement of batteries, i.e. until a full power cycle is detected.

According to another aspect of the invention, the electronic device comprises I/O ports which are set to "Hold" if the control signal is in the first state. This means that the I/O ports are deactivated in terms of the power consumption. This reduces not only the power consumption of the I/O ports but also significantly the power consumption of any additional stages or components that are coupled to the I/O ports. Dependent on the specific configuration of the electronic device, some I/O ports may be set to a high impedance state. The I/O ports may be configured as inputs and others as outputs. Setting the I/O ports to minimal power consumption allows minimizing the power consumption of the electronic device and stage and devices coupled to the I/O ports. Further, because the I/O ports are set to hold, there is no possibility for an external wake-up event of the electronic device. In other words, if the low power mode has been entered, the electronic device will not leave it until a full power cycle is detected, e.g. due to replacement of the batteries. It is not possible to trigger or exit this low power mode from outside of the electronic device, because the I/O ports are set to "Hold". Further there is no power consumption via or at the I/O ports. This reduces or minimizes the power consumption of the electronic device and/or other components in its ultra low power mode.

According to an aspect of the invention, it is further advantageous if the voltage level of the power cycle threshold is lower than a minimum operating voltage of the electronic device. For voltage levels below the minimum supply voltage, there is no defined operation of electronic devices according to the prior art. This undefined behavior may however lead to varying power consumption and in the worst case this power consumption may be undesirable high. In order to overcome this drawback, the electronic device according to aspects of the invention is configured to have a power cycle threshold level, which is below the minimum supply voltage level and thereby guarantees a defined state of the electronic device even in this voltage regime.

According to another aspect of the invention, the electronic device, e.g. the reset stage of the electronic device, comprises a comparator which is coupled to the supply voltage and to either one of the two reset voltage levels. The comparator may be configured to compare the supply voltage level with the coupled reset voltage level and may be further configured to generate the control signal. This comparator-based implementation is very cost-effective.

According to an embodiment of the invention, the electronic device further comprises a current mirror, an oscillator, a reference voltage source and a charge pump. The current mirror may be coupled to the supply voltage on the one hand and to the oscillator and the reference voltage source on the other hand. The reference voltage of the reference voltage source may be coupled to the charge pump. The oscillator may be coupled to the charge pump and may further drive the charge pump for generating one of the two reset voltage levels. Preferably, the current mirror is coupled to the supply voltage via a sensing resistor. Further, the reset voltage may be the power down threshold voltage. According to this aspect of the invention, the electronic device may be kept in a defined state even at voltages which are below the minimum supply voltage level of the electronic device. This feature may be provided mainly by help of the charge pump. The current mirror starts operation at the power cycle threshold which is lower than the voltage level of the power down threshold. Subsequently, the oscillator will start oscillating and driving the charge pump for providing the power down voltage level. This threshold level may be coupled to a comparator receiving said threshold voltage and the supply voltage. Accordingly, the electronic device according to aspects of the invention is set into the position to decide whether the supply voltage is too low for operation, even if the electronic device is supplied with said supply voltage level, which is too low for normal operation. Advantageously, the electronic device may be set into a defined low power mode at supply voltages which are well below the minimum operating voltage. The power consumption may be minimized even in this supply voltage regime, e.g. by setting the I/O ports to "Hold".

According to another aspect of the invention, the electronic device comprises an oscillator which provides a low-frequency clock signal and which is coupled to a buffer for buffering the clock signal. Further, the control signal may be coupled to the buffer, wherein the buffer is released if the control signal is in the first state. The low-frequency clock signal may be generated at voltage levels which are below a minimum operating voltage of the electronic device. Advantageously, further blocks or modules of the electronic device may be set into a low power mode by help of this clock signal.

According to another embodiment of the invention, the control signal comprises a Brownout signal and a Ports-On/Hold signal. The Brownout signal is set to "Disable" in the first interval and to "Enable" in the second interval. The Ports-On/Hold signal may be set to "Ports-On" if the Brownout signal is set to "Enable". Advantageously, the Brownout signal and the Ports-On/Hold signal are coupled. Accordingly, the power consumption of the electronic device may be minimized if the Brownout signal is set to "Disable" to cause the I/O ports of the electronic device to be set to "Hold".

The invention also provides a method of operating electronic device. The electronic device is set to a low power reset mode if the supply voltage level of the electronic device is between the power cycle threshold and the power down threshold level. Furthermore, the electronic device is enabled to enter an active mode if the supply voltage level of the electronic device is greater than the power down threshold level.

BRIEF DESCRIPTION OF DRAWINGS

Further aspects of the invention will appear from the appending claims and from the following detailed description given with reference to the appending drawings.

DETAILED DESCRIPTION OF EXAMPLE EMBODIMENTS

Figure 3:
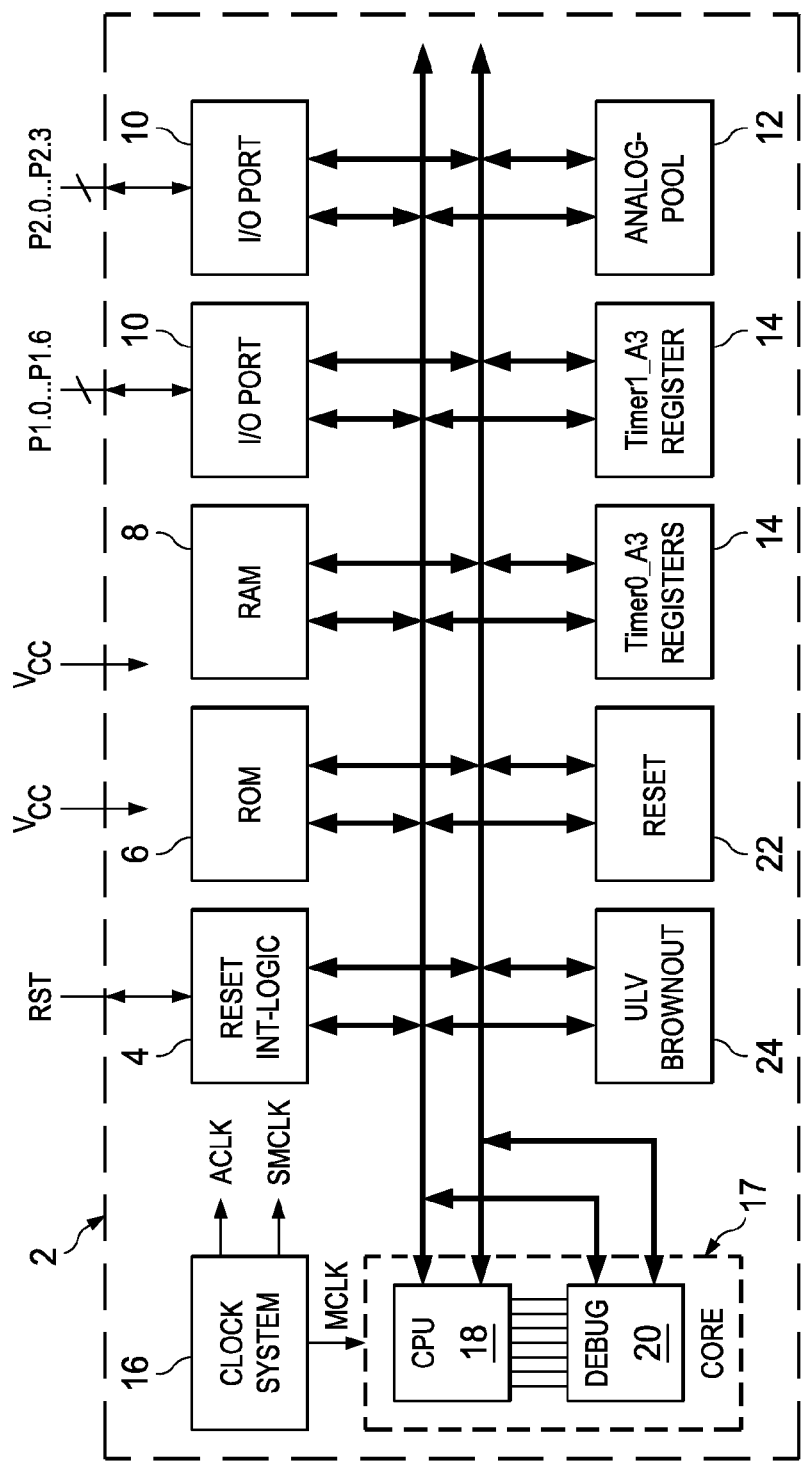
FIG. 3 shows a simplified block diagram of an electronic device according to an embodiment of the invention.

FIG. 3 is a simplified block diagram of an electronic device 2 according to an embodiment of the invention. The electronic device 2 comprises several functional blocks. Inter alia, the electronic device 2 comprises a reset system (Reset Int-Logic) 4, a read only memory (ROM) 6, a random access memory (RAM) 8 and I/O ports (I/O Port) 10. The reset block 4 features several inputs and outputs, e.g. an external reset input and output (RST). The I/O ports 10 feature several I/O lines P1.0 to P1.6 and P2.0 to P2.3. Any combination of input, output and interrupt conditions is possible. Further, the electronic device 2 comprises an analog functions module (Analog Pool) 12 providing a series of functions which can be configured to a digital-to-analog converter, multichannel analog-to-digital converter, supply voltage supervisor and comparator. Input voltage dividers and an internal reference source allow a wide range of combined analog functions. The timer block (Timer0_A3, Timer1_A3) 14 may be a 16-bit timer/counter with capture/compare registers. The timer0_A3 can support multiple capture/compares, PWM outputs and interval timing. Further, the timer0_A3 can have extensive interrupt capabilities. Interrupts may be generated by the counter on overflow conditions and by each of the capture/compare registers. The core 17 of the electronic device 2 comprises a CPU 18 which may have a 16-bit RISC architecture and a debug logic (Debug) 20. A clock system 16 provides several clock signals, e.g. a main clock signal MCLK, an auxiliary clock signal ACLK and a sub main clock signal SMCLK. Further, the electronic device 2 comprises a reset stage (Reset) 22 and an ultralow voltage Brownout module (ULV Brownout) 24.

Figure 4:
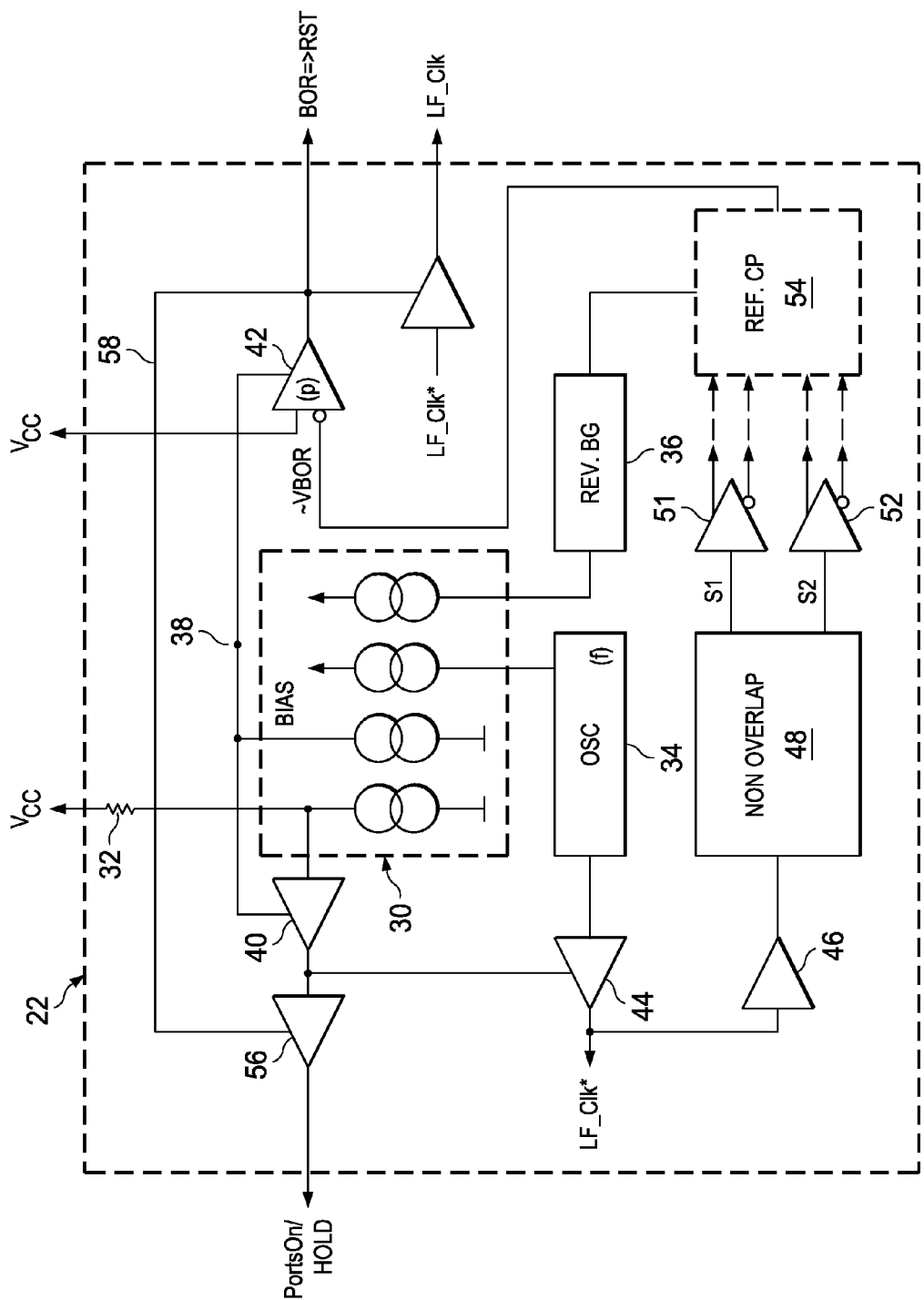
FIG. 4 shows a simplified block and circuit diagram of a reset stage in an electronic device according to an embodiment of the invention.

A simplified circuit and block diagram is shown in FIG. 4. For instance, this circuitry may be implemented in the reset stage 22 or may be a part of the Brownout module 24. By way of an example only and within the context of this specification, it is assumed that the reset stage 22 is implemented according to the simplified block and circuit diagram in FIG. 4.

The operation of the reset stage 22 will be outlined in the following. By way of an example only, it will be assumed that the reset stage 22 is supplied with a slightly increasing supply voltage VCC. For instance, the level of the supply voltage VCC starts at about 400 mV. At this very low supply voltage VCC, the blocks of the reset stage 22 are not supplied with suitable bias currents and therefore, the output signals, i.e. the Ports-On/Hold signal "PortsOn/Hold", the Brownout and reset signal BOR, RST and the low frequency clock signal LF_CLK are undefined. In principle, this has no negative impact to the rest of the electronic device 2 since the supply voltage VCC is extremely low.

If the supply voltage VCC rises slightly and exceeds the threshold voltage of the transistors of the bias generator 30 (by way of an example only, this threshold is about 475 mV), a small current will start to flow through the high impedance resistor 32 which is coupled between the supply voltage VCC and to the bias generator 30. The current mirror inside the bias generator 30 will provide a small current to the low voltage oscillator (OSC) 34. Consequently, the oscillator 34 will start operating and will provide an oscillating signal having a low amplitude. The current mirror 30 will also provide a small current to the reference band gap block (REV.BG) 36. However, the current which is coupled to the reference band gap block 36 will be too small and accordingly, the output voltage of the reference band gap block (REV.BG) 36 is expected to be still inaccurate.

By way of an example only, the supply voltage VCC increases further. Consequently, the bias generator 30 pulls down the line 38 and thereby sets the clock enable buffer 40 and the supply voltage comparator 42. The output signal of the oscillator 34 which coupled to the clock buffer 44 is slightly delayed. This is because with raising supply voltage VCC, the output of the clock enable buffer 40 sets the clock buffer 44 which buffers the low frequency output of the ultralow voltage oscillator 34. If the supply voltage VCC is sufficiently high to set the clock enable buffer 40, the supply voltage VCC will be high enough for the bias generator 30 to provide a suitable current to the ultralow voltage oscillator 34. Consequently, the ultralow voltage oscillator 34 will provide a stable oscillating signal, namely the low frequency clock signal LF_CLK*. The signal LF_CLK* is coupled to a clock forwarding buffer 46. The clock forwarding buffer 46 is coupled to a non overlapping clock signal generator (non overlap) 48. The signal generator 48 provides non overlapping clock signals S1 and S2 which are coupled to differential clock buffers 51 and 52, respectively. Output signals of the differential clock buffers 51 and 52 are coupled to a charge pump (Ref.CP) 54.

At the same time, the bias generator 30 provides a suitable current to the reference band gap block 36. Accordingly, the reference band gap block 36 generates a predetermined reference voltage, which may be about 475 mV, which is coupled to the charge pump 54.

The charge pump 54 uses this voltage as a reference voltage and consequently, at the output of the charge pump 54, there is a voltage which is approximately a multiple of this reference voltage. By way of an example only, the charge pump 54 provides a voltage of about 900 mV which is approximately a Brownout voltage VBOR of the electronic device 2.

The voltage of the charge pump 54 is coupled to the supply voltage comparator 42. Accordingly, the supply voltage comparator 42 sets the output signal which is, according to the embodiment, the Brownout signal BOR and a reset signal RST to LOW, as long as the supply voltage VCC does not exceed the Brownout voltage VBOR. The output of the supply voltage comparator 42 is coupled to a Ports-On/Hold buffer 56 by line 58. Consequently, as long as the reset and Brownout signal BOR, RST are set to LOW, the Ports-On/Hold signal is set to HOLD, because the Ports-On/Hold buffer 56 is disabled.

In other words, the reset stage 22 of the electronic device 2, according to aspects of the invention, is capable of setting the Ports-On/Hold signal as well as the reset and Brownout signals RST, BOR to well-defined states (namely the LOW state), even if the electronic device 2 is supplied with a supply voltage level VCC which is well below a minimum operating voltage of the electronic device 2. This avoids an uncontrolled or undefined current consumption of the electronic device at low supply voltages VCC.

The reset stage may be provided with the outlined functionality mainly because the low frequency oscillator 34 starts oscillating at very low voltages and thereby allows operation of a charge pump 54. The latter outputs a multiple of the reference voltage which is coupled to the charge pump 54 by the reference band gap 36. Consequently, the supply voltage comparator 42 is provided with a reference voltage which is near to the Brownout voltage VBOR of about 900 mV, even if the supply voltage VCC is well below this voltage level. This allows setting the reset signal RST and the Ports-On/Hold signal to a defined state in this low voltage regime.

The clearly defined state of the output signal of the reset stage 22 allow defining an ultra low power mode of the electronic device 2 wherein there will be no response to a wakeup event e.g. via the I/O ports P1.0 to P1.6 and P2.0 to P2.3 (see FIG. 3). Further, by way of an example only, a non-maskable interrupt (NMI) may be set.

If the supply voltage VCC rises further and exceeds the Brownout level VBOR, the supply voltage comparator 42 is released and the Brownout signal BOR is set to HIGH. At the same point in time, the Ports-On/Hold buffer 56 is released and the Ports-On/Hold signal allows operation of the I/O ports. Accordingly, the electronic device 2 will start operating.

Figures 1A, 1B, 1C:
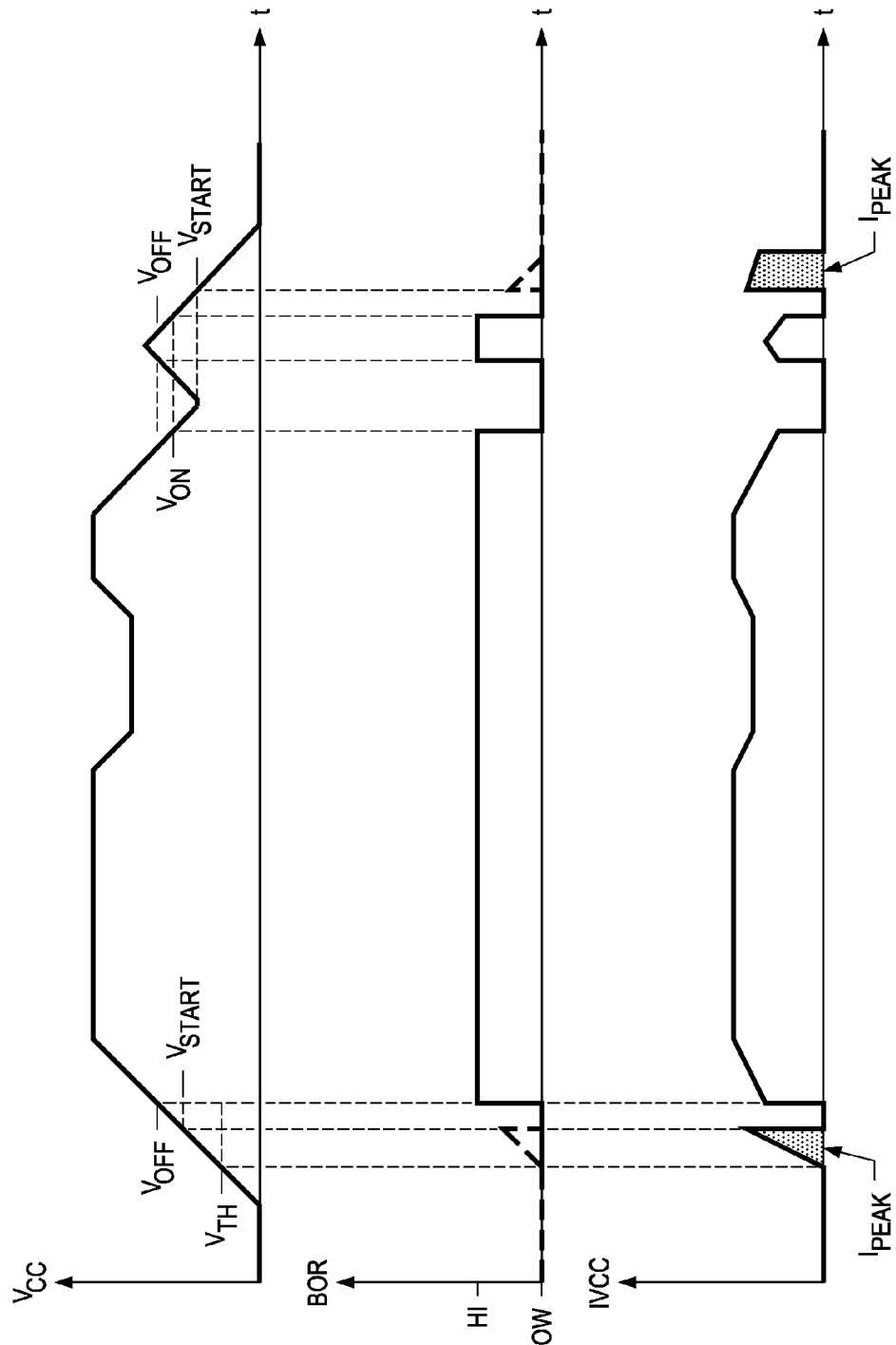
FIG. 1a) to c) illustrate a time dependent power consumption of an electronic device according to the prior art which is supplied with a varying supply voltage.
Figure 2:
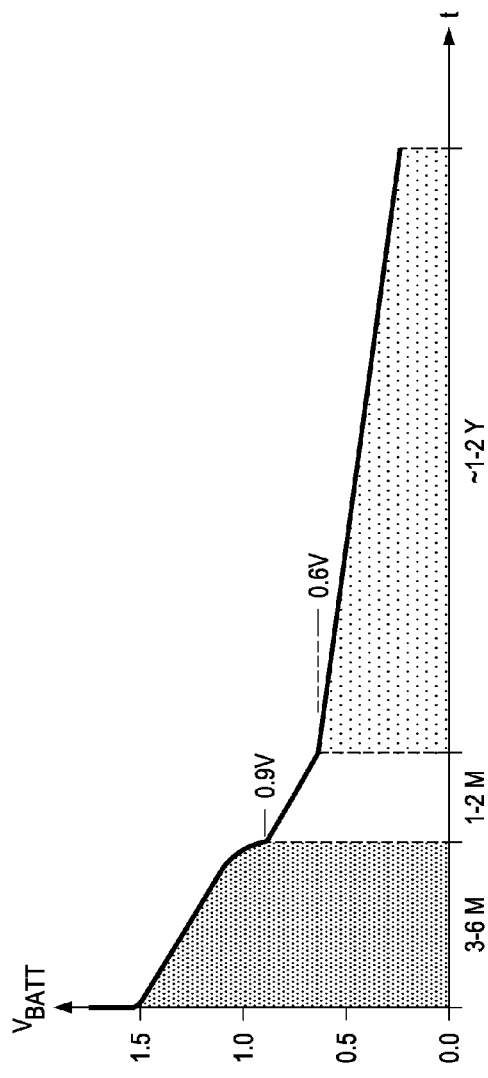
FIG. 2 shows a time dependent plot for the supply voltage of a battery powered electronic device according to the prior art.
Figure 5:
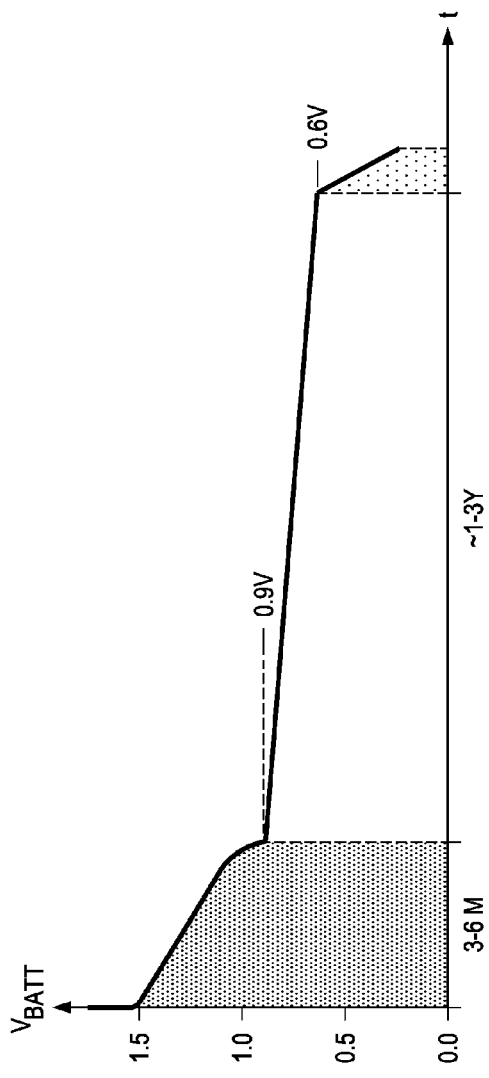
FIG. 5 shows a time dependent plot for the supply voltage of a battery powered electronic device according to an embodiment of the invention.

FIG. 5 is a time dependent diagram for the supply voltage VBAT for a battery driven electronic device 2, according to an embodiment of the invention. During a first period of time, which typically takes about several months, the electronic device 2 operates properly and the supply voltage VBAT drops from the nominal voltage at about 1.5 V to approximately 900 mV which is about the Brownout voltage level VBOR. At this supply voltage (VBAT=VCC), the electronic device 2 enters an ultra low power mode. The electronic device 2 will not leave this ultra low power mode until a complete power cycle is detected, i.e. the battery is replaced. This will cause the second period of time to take up to several years. During this time, there is a minimum risk for battery leakage only.

Although the invention has been described in detail, it should be understood that various changes, substitutions and alterations can be made thereto without departing from the spirit and scope of the invention as defined by the appended claims.

The invention claimed is:

1. An electronic device comprising having a reset stage, and being configured to have a power down threshold and a power cycle threshold:
   a voltage level of the power cycle threshold being lower than a voltage level of the power down threshold which is below a minimum operating voltage of the device, and wherein these two reset threshold levels define a first and a second interval for a supply voltage of the electronic device;
   the first interval being between the power cycle threshold and the power;
   the reset stage being configured to provide a control signal having a defined first state in the first interval and a defined second state in the second interval, wherein the electronic device is set to a low power reset mode if the control signal is in the first state and wherein the electronic device is enabled to enter an active mode if the control signal is in the second state;
   further comprising a comparator which is coupled to the supply voltage and to either one of the two reset voltage levels, and wherein the comparator is configured to compare the supply voltage level with the coupled reset voltage level and to generate the control signal; and a current mirror, an oscillator, a reference voltage source and a charge pump, wherein the current mirror is coupled to the supply voltage on the one hand and to the oscillator and to the reference voltage source on the other hand, wherein the reference voltage of the reference voltage source is coupled to the charge pump and the oscillator is coupled to and is driving the charge pump for generating one of the two reset voltage levels.

2. The electronic device according to claim 1, further comprising I/O ports which are configured to have a reduced power consumption if the control signal is in the first state.

3. The electronic device according to claim 1, further comprising an oscillator which provides a low-frequency clock signal and which is coupled to a buffer for buffering the clock signal and wherein the control signal is coupled to the buffer, wherein the buffer is released if the control signal is in the first state.

4. The electronic device according to claim 1, wherein the control signal comprises a Brownout signal and a Ports-On/Hold signal, which is configured to set I/O ports to a reduced power consumption, and wherein the Brownout signal is set to "Disable" in the first interval and to "Enable" in the second interval, and wherein the Ports-On/Hold signal is set to "Ports-On", if the Brownout signal is set to "Enable".

* * * * *